United States Patent
Watanabe et al.

[11] Patent Number: 6,096,796
[45] Date of Patent: Aug. 1, 2000

[54] PHOTO-CURABLE RESIN COMPOSITION

[75] Inventors: Tsuyoshi Watanabe; Tetsuya Yamamura; Akira Takeuchi; Takashi Ukachi, all of Abaraki, Japan

[73] Assignees: DSM N.V., Heerlen, Netherlands; JSR Corporation; Japan Fine Coatings Co., Ltd., both of Tokyo, Japan

[21] Appl. No.: 08/988,237

[22] Filed: Dec. 10, 1997

[30] Foreign Application Priority Data

Dec. 10, 1996 [JP] Japan .................................. 8-329303

[51] Int. Cl.[7] .................................. C08J 3/28; C08F 2/48; G03C 5/00
[52] U.S. Cl. .......................... 522/100; 522/167; 522/170; 522/31; 522/97; 522/25; 522/29; 522/81; 430/269; 430/270.1; 430/280.1; 430/281.1
[58] Field of Search .................................. 522/31, 29, 25, 522/97, 168, 170, 100; 427/517; 430/269, 270.1, 280.1, 281.1

[56] References Cited

U.S. PATENT DOCUMENTS

| | | | |
|---|---|---|---|
| 4,139,655 | 2/1979 | Tsao | 427/44 |
| 4,383,025 | 5/1983 | Green et al. | 430/280.1 |
| 4,564,651 | 1/1986 | Markert et al. | 524/589 |
| 4,575,330 | 3/1986 | Hull | 425/174.4 |
| 4,631,306 | 12/1986 | Markert et al. | 523/457 |
| 4,977,199 | 12/1990 | Koleske et al. | 522/31 |
| 5,036,135 | 7/1991 | Gentzkow et al. | 524/786 |
| 5,149,767 | 9/1992 | Munk et al. | 528/71 |
| 5,296,567 | 3/1994 | Baumann et al. | 526/172 |
| 5,434,196 | 7/1995 | Ohkawa et al. | 522/100 |
| 5,468,886 | 11/1995 | Steinmann et al. | 549/549 |
| 5,476,748 | 12/1995 | Steinmann et al. | 430/269 |
| 5,502,083 | 3/1996 | Abe et al. | 522/31 |

FOREIGN PATENT DOCUMENTS

| | | |
|---|---|---|
| 49-17040 | 2/1974 | Japan . |
| 50-151996 | 12/1975 | Japan . |
| 50-151997 | 12/1975 | Japan . |
| 50-158680 | 12/1975 | Japan . |
| 50-158698 | 12/1975 | Japan . |
| 52-30899 | 3/1977 | Japan . |
| 55-125105 | 9/1980 | Japan . |
| 56-8428 | 1/1981 | Japan . |
| 56-149402 | 11/1981 | Japan . |
| 57-192429 | 11/1982 | Japan . |
| 60-247515 | 12/1985 | Japan . |
| 62-35966 | 2/1987 | Japan . |
| 62-101408 | 5/1987 | Japan . |
| 63-37034 | 2/1988 | Japan . |
| 63-176337 | 7/1988 | Japan . |
| 63-229381 | 9/1988 | Japan . |
| 1-204915 | 8/1989 | Japan . |
| 1-213304 | 8/1989 | Japan . |
| 2-28261 | 1/1990 | Japan . |
| 2-75618 | 3/1990 | Japan . |
| 2-208305 | 8/1990 | Japan . |
| 3-160013 | 7/1991 | Japan . |
| 5-24119 | 2/1992 | Japan . |
| 6-228413 | 8/1994 | Japan . |
| 97/38354 | 10/1997 | Japan . |
| WO 97/38354 | 10/1997 | WIPO . |

*Primary Examiner*—James J. Seidleck
*Assistant Examiner*—Sanza L. McClendon
*Attorney, Agent, or Firm*—Pillsbury Madison & Sutro

[57] ABSTRACT

A photo-curable resin composition capable of providing a three-dimensional object having excellent mechanical strength and high dimensional accuracy when used in a photo-fabrication process. The resin composition is also capable of providing a three-dimensional object with excellent stability in shape and properties in a photo-fabrication process. The photo-curable composition includes:

(A) a compound represented by the formula (1)

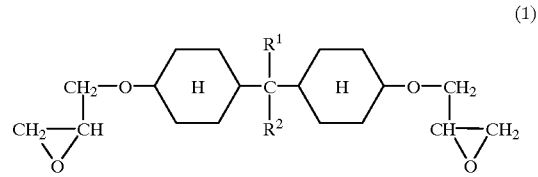

(1)

wherein $R^1$ and $R^2$ independently represent a hydrogen atom or a methyl group;

(B) a compound having a cyclohexene oxide structure;
(C) a cationic photo-initiator;
(D) an ethylenically unsaturated monomer;
(E) a radical photo-initiator; and
(F) a polyol having three or more hydroxyl groups.

11 Claims, 1 Drawing Sheet

PHOTO-CURABLE RESIN COMPOSITION

FIELD OF THE INVENTION

The present invention relates to a photo-curable resin composition, especially to a liquid photo-curable resin composition exhibiting excellent moisture resistance and water resistance and is further suitable as material useful in photo-fabrication processes.

BACKGROUND OF THE INVENTION

In recent years, photo-fabrication processes for forming three-dimensional objects consisting of integrally laminated cured resin layers prepared by repeating a step of forming a cured resin layer by selectively irradiating a liquid photo-curable material with light have been proposed (see Japanese Patent Application Laid-open No. 247515/1985, USP No. 4,575,330 (Japanese Patent Application Laid-open No. 35966/1987), Japanese Patent Application Laid-open No. 101408/1987, Japanese Patent Application Laid-open No. 24119/1993).

A typical example of such a photo-fabrication process comprises forming a curable resin layer having a specified pattern by selectively irradiating with light using, for example, an ultraviolet radiation laser on the surface of a liquid photo-curable material or photo-curable resin composition, feeding the photo-curable resin composition equivalent to one layer to form another thin layer of the composition over this cured resin layer, and selectively irradiating this thin layer with light to form a new cured resin layer which is integrally laminated over the previously formed cured resin layer. This step is repeated a number of times, with or without changing the pattern in which the light is irradiated to form a three-dimensional object consisting of integrally laminated multiple cured resin layers. This photo-fabrication process has been attracting considerable attention, because the target three-dimensional object can easily be prepared in a short period of time even if it has a complicated shape.

The following resin compositions are photo-curable resin compositions useful in photo-fabrication processes:

(A) resin compositions containing a radically polymerizable compound such as urethane(meth)acrylate, oligoester(meth)acrylate, epoxy(meth)acrylate, thiol-ene compounds, photosensitive polyimide, and the like (see Japanese Patent Applications Laid-open No. 204915/1989, No. 208305/1990, and No. 160013/1991);

(B) resin compositions containing a cationically polymerizable organic compound such as an epoxy compound, cyclic ether compound, cyclic lactone compound, cyclic acetal compound, cyclic thioether compound, spiro-orthoester compound, vinylether compound, and the like (see Japanese Patent Application Laid-open No. 213304/1989);

(C) resin compositions containing a radically polymerizable organic compound and a cationic polymerizable organic compound (see Japanese Patent Applications Laid-open No. 28261/1990, No. 75618/1990, and No. 228413/1994).

These photo-curable resin compositions require low viscosity in order to form a smooth liquid level, as well as the ability to be rapidly cured upon irradiation. Additionally, minimal swelling of the cured products, and minimal deformation resulting from shrinkage during curing with light, or production defects, such as: production of warped parts, indented parts resulting in sink marks, or stretched parts resulting in overhanging parts, are also required.

Three-dimensional objects prepared by photo-fabrication methods have conventionally been used for design models and trial mechanical parts. High dimensional accordance with the design model in fine processing, mechanical strength, heat resistance, moisture resistance, and water resistance sufficient to withstand conditions of use are especially demanded of these trial mechanical parts.

However, no conventional resin composition can satisfy the above demands. The three-dimensional objects obtained by the photo-fabrication processes exhibit problems of deformation with the passage of time, resulting in of warped parts, or indented parts, or stretched parts (overhanging parts), because of residual strain due to the shrinkage during curing. These problems of deformation with the passage of time can be partly solved by the correction of the input data to the CAD. However, the correction is insufficient to account for modern requirements of intricate fineness and complication in shape, and to circumstantial variations of use.

Mechanical characteristics of three-dimensional objects prepared by photo-fabrication using conventional resin compositions containing an epoxy compound are degraded in the course of time in accordance with environmental conditions such as temperature and humidity. Therefore, use of conventional three-dimensional objects is unsuitable for an application requiring mechanical strength over an extended period of time.

Also, no three-dimensional object prepared using the conventional resin compositions is capable of meeting the requirements for the trial mechanical parts such as mechanical strength, dimensional accuracy, heat resistance, moisture resistance, water resistance, and the like.

The present invention has been developed in view of this situation and has an object of providing a novel photo-curable resin composition.

Another object of the present invention is to provide a photo-curable resin composition capable of being fabricated to produce three-dimensional objects which have mechanical strength and high dimensional accuracy and are suitable for trial mechanical parts.

Still another object of the present invention is to provide a photo-curable resin composition which can be fabricated to produce three-dimensional objects provided with lasting minimal deformation characteristics.

A further object of the present invention is to provide a photo-curable resin composition capable of being fabricated to produce a three-dimensional object provided with lasting minimal degradation in mechanical characteristics.

A still further object of the present invention is to provide a photo-curable resin composition capable of being fabricated to produce a three-dimensional object which can be used in water and high moisture environments.

SUMARRY OF THE INVENTION

The above objects can be attained in the present invention by a photo-curable resin composition comprising, the following components:

(A) a compound represented by the formula (1),

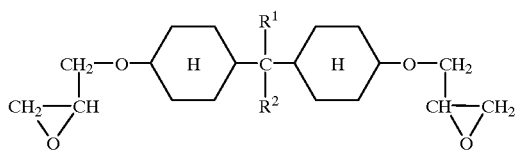

(1)

wherein $R^1$ and $R^2$ independently represent a hydrogen atom or a methyl group;

(B) a compound having a cyclohexene oxide structure;

(C) a cationic photo-initiator;

(D) an ethylenically unsaturated monomer;

(E) a radical photo-initiator; and (F) a polyol having three or more hydroxyl groups.

DETAILED DESCRIPTION OF THE INVENTION AND PREFERRED EMBODIMENTS

Figure 1:
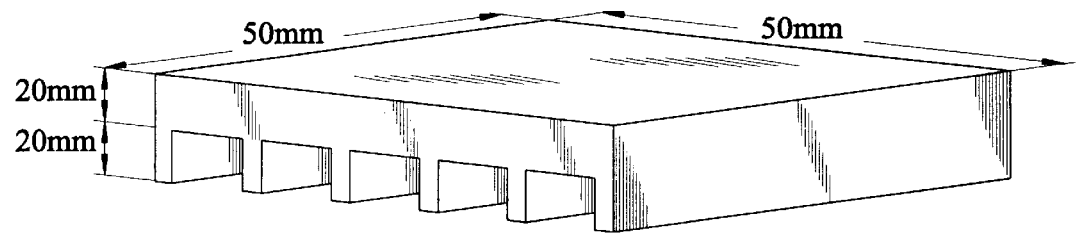
FIG. 1 is a perspective view of a camber model used for measuring deformation rate with time in the Examples.

The present invention will now be explained in detail.

Component (A)

Component (A) is an organic compound which can be polymerized or crosslinked by photo-irradiation in the presence of a cationic photo-initiator. Such an organic compound is hereinafter called "cationically polymerizable organic compound." Epoxy compounds having glycidyl ether groups at both terminals represented by formula (1) are useful as the cationically polymerizable organic compound, component (A).

Preferred examples of epoxy compounds useful as component (A) are: hydrogenated bisphenol A diglycidyl ethers, hydrogenated bisphenol F diglycidyl ethers, and hydrogenated bisphenol AD diglycidyl ethers.

Preferred examples of commercially available epoxy compounds useful as component (A) are: EP-4080 (manufactured by Asahi Denka Kogyo K. K.), EPOLIGHT 4000 (Kyoeisha Chemical Industry Co., Ltd.), and Suntoto ST3000 (manufactured by Toto Kasei Co., Ltd.).

The above epoxy compounds can be used as component (A) either individually or in combinations of two or more.

The proportion of component (A) in the photo-curable resin composition of the present invention is generally 5–40% by weight, preferably 7–35% by weight, and more preferably 10–30% by weight. If the proportion of component (A) is too low, the three-dimensional object prepared from the resulting resin composition tends to deform over time and the toughness, moisture resistance, and water resistance are reduced. On the other hand, if the proportion of component (A) is too high, the photocurability of the resulting resin composition is decreased, leading to a reduction in fabricating efficiency.

Component (B)

The compounds having a cyclohexene oxide structure which are useful as a component of the photo-curable resin composition of the present invention, are cationic polymerizable organic compounds, component (B).

Examples of compounds having a cyclohexene oxide structure and useful as component (B) are:

3,4-epoxycyclohexylmethyl-3',4'-epoxycyclohexane carboxylate, 5 2-(3,4-epoxycyclohexyl-5,5-spiro-3, 4-epoxy)cyclohexane-metha-dioxane, bis(3,4-epoxycyclohexylmethyl) adipate, vinyl cyclohexene oxide, 4-vinylepoxycyclohexane, bis(3,4-epoxy-6-methylcyclohexylmethyl) adipate, 3,4-epoxy-6-methyl cyclohexyl-3',4'-epoxy-6'-methylcyclohexane carboxylate, methylenebis(3,4-epoxycyclohexane), dicyclopentadiene diepoxide, di(3,4-epoxycyclohexylmethyl) ether of ethylene glycol, ethylenebis(3,4-epoxycyclohexane carboxylate), lactone modified 3,4-epoxycyclohexylmethyl-3',4'-epoxycyclohexane carboxylate, epoxidated tetrabenzyl alcohol, lactone modified epoxydated tetrahydrobenzyl alcohol, and cyclohexene oxide.

Compounds having two or more alicyclic groups, are especially preferred. Examples of said especially preferred compounds are:

3,4-epoxycyclohexylmethyl-3',40-epoxycyclohexane carboxylate and bis(3,4-epoxycyclohexylmethyl) adipate. If these epoxy compounds are present in an amount of 50–100% by weight, the cure rate of the cationic polymerization reaction is accelerated, thereby shortening the fabrication time and reducing the shrinkage rate, which reduces the restraining deformation over time of three-dimensional objects.

Examples of the commercially available cyclohexene oxide products useful as component (B) are: UVR-6100, UVR-6105, UVR-6110, UVR-6128, UVR-6200 (manufactured by Union Carbide Corp), Celoxide 2021, Celoxide 2021P, Celoxide 2081, Celoxide 2083, Celoxide 2085, Celoxide 2000, Celoxide 3000, Cyclomer A200, Cyclomer M100, Cyclomer M101, Epolead GT-301, Epolead GT-302, Epolead 401, Epolead 403, ETHB, Epolead HD300 (manufactured by Daicel Chemical Industry Co., Ltd.), and KRM-2110, KRM-2199 (manufactured by Asahi Denka Kogyo K.K.).

The above compounds having a cyclohexene oxide structure may be used as component (B) either individually or in combinations of two or more.

The proportion of component (B) in the photo-curable resin composition of the present invention is 30–80% by weight, preferably 35–75% by weight, and more preferably 40–70% by weight. If the proportion of component (B) is too low, the photo-curability of the resulting resin composition is reduced, leading to a reduction of fabricating efficiency. If the proportion of component (B) is too high, the toughness and dimensional accuracy of the resulting three-dimensional object is reduced.

Component (C)

The cationic photo-initiator used as component (C) is a compound capable of generating a molecule initiating cationic polymerization of components (A) and (B) by photo-irradiation. Examples of the cationic photo-initiator are onium salts illustrated by the following formula (2), which are a compound releasing Lewis acid on receiving light:

(2)

wherein the cation is onium; Z represents S, Se, Te, P, As, Sb, Bi, O, I, Br, Cl, or N≡N; $R^3$, $R^4$, $R^5$, and $R^6$ represent individually the same or a different organic group; a, b, c, and d represent individually an integer from 0 to 3, and the sum of a, b, c, and d (=a+b+c+d) is equal to the valence number of Z. Also, M represents a metal or metalloid which constitutes a center atom of a halide complex. Typical examples of M are B, P, As, Sb, Fe, Sn, Bi, Al, Ca, In, Ti, Zn, Sc, V, Cr, Mn, and Co. X represents a halogen atom. m is a substantial electric charge of the halide complex and n is the valence of M.

Specific examples of the negative ion ($MX_n$) in the above formula (2) are tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$).

Also, onium salts containing a negative ion represented by the general formula $[MX_n(OH)^{-1}]$ can be used. Further, onium salts including a negative ion, for example, perchloric acid ion ($ClO_4^-$), trifluoromethane sulfonate ion ($CF_3SO_3^-$), fluorosulfonate ion ($FSO_3^-$), toluene sulfonate ion, trinitrobenzene sulfonate negative ion, and trinitrotoluene sulfonate negative ion are suitable.

The above-mentioned cationic photo-initiators can be used as component (C) either individually or in combinations of two or more.

Among these onium salts, especially effective as component (C) are aromatic onium salts, in which the following compounds are preferable: aromatic halonium salts described, for example, in Japanese Patent Applications Laid-open No. 151996/1975 and No. 158680/1975; VIA group aromatic onium salts described, for example, in Japanese Patent Applications Laid-open No. 151997/1975, No. 30899/1977, No. 55420/1981, and No. 125105/1980; VA group aromatic onium salts described, for example, in Japanese Patent Application Laid-open No. 158698/1975; oxosulfoxonium salts described, for example, in Japanese Patent Applications Laid-open No. 8428/1981, No. 149402/1981, and No. 192429/1982; aromatic diazonium salts described, for example, in Japanese Patent Application Laid-open No. 17040/1974; and thiobililium salts described in the specification of U.S. Pat. No. 4,139,655. Iron/allene complex and aluminum complex/photo-decomposed silica compound initiator are also given as examples of the onium salts.

Examples of commercially available products useful as cationic photo-initiators are: UVI-6950, UVI-6970, UVI-6974, UVI-6990 (manufactured by Union Carbide Corp), Adekaoptomer SP-150, SP-151, SP-170, SP-171 (manufactured by Asahi Denka Kogyo K. K.), Irgacure 261 (manufactured by Ciba Geigy), CI-2481, CI-2624, CI-2639, CI-2064 (manufactured by Nippon Soda Co., Ltd.), CD-1010, CD-1011, CD-1012 (manufactured by Sartomer Co., Ltd.), DTS-102, DTS-103, NAT-103, NDS-103, TPS-103, MDS-103, MPI-103, BBI-103 (manufactured by Midori Chemical Co., Ltd.). Among these, UVI-6970, UVI-6974, Adekaoptomer SP-170, SP-171, CD-1012, MPI-103 are particularly preferable to develop high curing sensitivity of the resin composition which contains these compounds.

The above cationic photo-initiators can be used as component (C) either individually or in combinations of two or more.

The proportion of component (C) in the photo-curable resin composition is 0.1–10% by weight, preferably 0.2–5% by weight, and more preferably 0.3–3% by weight. If the proportion of component (C) is too low, the photo-curing characteristic of the resulting resin composition is insufficient, and the resulting three-dimensional object does not possess the desired mechanical strength. On the other hand, if the proportion of component (C) is too high, an appropriate curing depth, as measured by light transmission capability, is not attainable when the resulting resin composition is used in the photo-fabrication process. The mechanical strength of the resulting three-dimensional object, as measured by toughness of said three-dimensional object, also tends to be lower.

Component (D)

The ethylenically unsaturated monomer is a compound having ethylenically unsaturated groups (C=C) in the molecule. Examples of compounds suitable for use as component (D) are: mono-functional monomers having one ethylenically unsaturated bond, and poly-functional monomers having two or more ethylenically unsaturated bonds.

Preferable mono-functional monomers useful as component (D) are: (meth)acrylamide, (meth)acryloyl morpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth)acrylate, t-octyl (meth) acrylamide, diacetone (meth)acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth) acrylate, N,N-dimethyl (meth)acrylamide tetrachlorophenyl (meth)acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinyl caprolactam, N-vinyl pyrrolidone, phenoxyethyl (meth)acrylate, butoxyethyl (meth)acrylate, pentachlorophenyl (meth)acrylate, pentabromophenyl (meth)acrylate, polyethylene glycol mono-(meth)acrylate, polypropylene glycol mono-(meth)acrylate, bornyl (meth)acrylate, methyltriethylene diglycol (meth)acrylate, and the compounds represented by the following general formulas (3) to (5).

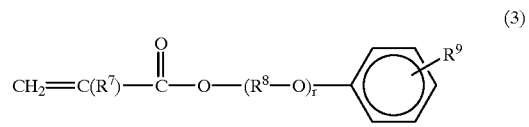

(3)

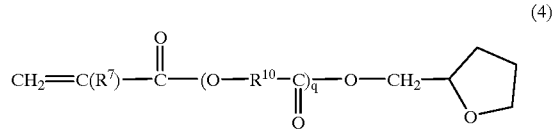

(4)

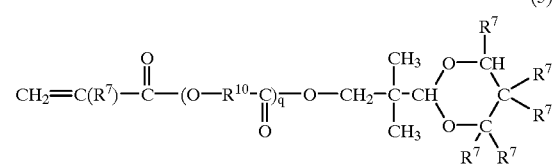

(5)

wherein $R^7$ represents a hydrogen atom or a methyl group, $R^8$ represents an alkylene group containing 2–6, preferably 2–4 carbon atoms, $R^9$ represents a hydrogen atom or an alkyl group containing 1–12, preferably 1–9 carbon atoms, $R^{10}$ represents an alkylene group containing 2–8, preferably 2–5 carbon atoms, r denotes an integer from 0–12, preferably from 1–8, and q denotes an integer from 1–8, preferably from 1–4.

Among these monofunctional monomers, isobornyl (meth)acrylate, lauryl (meth)acrylate, and phenoxyethyl (meth)acrylate are particularly preferable.

Examples of commercially available products useful as monofunctional monomers are: Aronix M-101, M-102, M-111, M-113, M-117, M-152, TO-1210 (manufactured by Toagosei Co., Ltd.), KAYARAD TC-110S, R-564, R-128H (manufactured by Nippon Kayaku Co., Ltd.), and Viscoat 192, Viscoat 220, Viscoat 2311HP, Viscoat 2000, Viscoat 2100, Viscoat 2150, Viscoat 8F, Viscoat 17F (manufactured by Osaka Organic Chemical Industry, Co., Ltd.)

Preferable examples of polyfunctional monomers useful as component (D) are: ethylene glycol di(meth)acrylate, dicyclopentenyl di(meth)acrylate, triethylene glycol di(meth)acrylate, tetraethylene glycol di(meth)acrylate, tricyclodecanediyldimethylene di(meth)acrylate, tris(2-hydroxyethyl)isocyanurate di(meth)acrylate, tris(2-hydroxyethyl)isocyanurate tri(meth)acrylate, caprolactone modified tris(2-hydroxylethyl)isocyanurate tri(meth)acrylate, trimethylolpropane tri(meth)acrylate, ethylene oxide (hereinafter called EO) modified trimethylolpropane tri(meth)acrylate, propylene oxide (hereinafter called PO) modified trimethylolpropane tri(meth)acrylate, tripropylene glycol di(meth)acrylate, neopentyl glycol di(meth)acrylate, both terminal (meth)acrylic acid adduct of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone modified dipentaerythritol hexa(meth)acrylate, caprolactone modified dipentaerythritol penta(meth)acrylate, ditrimethylolpropane tetra(meth)acrylate, EO modified bisphenol A di(meth)acrylate, PO modified bisphenol A di(meth)acrylate, EO modified hydrogenated bisphenol A di(meth)acrylate, PO modified hydrogenated bisphenol A di(meth)acrylate, EO modified bisphenol F di(meth)acrylate, and (meth)acrylate of phenol novolac polyglycidyl ether.

Given as examples of commercially available products of these polyfunctional monomers are SA1002 (manufactured by Mitsubishi Chemical Corp.), Viscoat 195, Viscoat 230, Viscoat 260, Viscoat 215, Viscoat 310, Viscoat 214HP, Viscoat 295, Viscoat 300, Viscoat 360, Viscoat GPT, Viscoat 400, Viscoat 700, Viscoat 540, Viscoat 3000, Viscoat 3700 (manufactured by Osaka Organic Chemical Industry, Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku Co., Ltd.), Aronix M-210, M-220, M-233, M-240, M-215, M-305, M-309, M-310, M-315, M-325, M-400, M-6200, M-6400 (manufactured by Toagosei Co., Ltd.), Light acrylate BP-4EA, BP-4PA, BP-2EA, BP-2PA, DCP-A (manufactured by Kyoeisha Chemical Industry Co., Ltd.), New Frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showa Highpolymer Co., Ltd.), and NK Ester A-BPE-4 (manufactured by Shin-Nakamura Chemical Industry Co., Ltd.).

The polyfunctional monomer having three or more polyfunctional groups can be selected from the above-mentioned tri(meth)acrylate compounds, tetra(meth)acrylate compounds, penta(meth)acrylate compounds, and hexa (meth)acrylate compounds. Among these, trimethylol propane tri(meth)acrylate, EO modified trimethylolpropane tri (meth)acrylate, dipentaerythritol hexa(meth)acrylate, dipentaerythritol penta(meth)acrylate, and ditrimethylolpropane tetra(meth)acrylate are particularly preferable.

The above monofunctional monomers and polyfunctional monomers may be used as component (D) either individually or in combinations of two or more.

It is preferred that the polyfunctional monomers having three or more ethylenically unsaturated bonds be present in an amount of more than 60% by weight in component (D). The proportion of the polyfunctional monomer having three or more functional groups is more preferably more than 80% by weight. A particularly preferable proportion of the polyfunctional monomer having three or more functional groups is 100% by weight. If the proportion of the polyfunctional monomer having three or more functional groups is less than 60% by weight, the photocuring characteristic of the resulting resin composition is insufficient and the three-dimensional object fabricated tends to deform over time.

The proportion of component (D) in the photo-curable resin composition of the present invention is generally 5–30% by weight, preferably 7–25% by weight, and more preferably 10–20% by weight. If the proportion of component (D) is too low, the photo-curing characteristic of the resin composition is insufficient. A three-dimensional object with sufficient mechanical strength cannot be fabricated from such a resin composition. On the other hand, if the proportion of component (D) is too high, the resulting resin composition shrinks easily during photo-curing and the mechanical strength such as toughness of the three-dimensional object tends to be reduced.

Component (E)

The radical photo-initiator is a compound which decomposes and generates radicals on receiving radiation from a source such as light, thereby initiating the curing reaction.

Examples of radical photo-initiators useful as component (E) are acetophenone, acetophenone benzyl ketal, anthraquinone, 1-(4-isopropylphenyl)-2-hydroxy-2-methylpropane-1-one, carbazole, xanthone, 4-chlorobenzophenone, 4,4'-diaminobenzophenone, 1,1-dimethoxydeoxybenzoin, 3,3'-dimethyl-4-methoxybenzophenone, thioxanethone compounds, 2-methyl-1-[4-(methylthio)phenyl]-2-morpholino-propane-2-one, 2-benzyl-2-dimethylamino-1-(4-morpholinophenyl)-butane-1-one, triphenylamine, 2,4,6-trimethylbenzoyl diphenylphosphine oxide, bis(2,6-dimethoxybenzoyl)-2,4,4-tri-methylpentylphosphi ne oxide, benzyl dimethyl ketal, 1-hydroxycyclohexylphenyl ketone, 2-hydroxy-2-methyl-1-phenylpropane-1-one, fluorenone, fluorene, benzaldehyde, benzoin ethyl ether, benzoin propyl ether, benzophenone, Michler's ketone, 3-methylacetophenone, 3,3',4,4'-tetra(t-butylperoxycarbonyl)benzophenone (BTTB), and combined compositions of BTTB and xanthene, thioxanthene, cumarin, ketocumarin or other coloring matter photosensitizer. Among these, benzyl dimethyl ketal, 1-hydroxycyclohexylphenyl ketone, 2,4,6-trimethylbenzoyl diphenylphosphine oxide, 2-benzyl-2-dimethylamino-1-(4-morpholinophenyl)-butane-1-one, and the like are particularly preferred.

These radical photo-initiators may be used either individually or in combinations of two or more.

The proportion of component (E) in the photo-curable resin composition of the present invention is usually 0.01–10% by weight and preferably 0.1–8% by weight. If the proportion of component (E) is too low, the curing rate of the radically polymerizable reaction is detrimentally reduced, thereby extending the fabricating time and lowering the resolution. On the other hand, if the proportion of component (E) is too high, the excess polymerization initiator adversely effects the resin composition's curing characteristics, and the specification, heat resistance, and handling of the three-dimensional object obtained from the resin composition.

Component (F)

The polyol having three or more hydroxyl groups is an essential component for developing the photo-curability of the resin composition. The polyol provides the three-dimensional object with resistance to deformation over time (i.e., shape stability) over time and resistance to change in mechanical characteristics over time (i.e., physical property stability). (over time) The polyol used as component (F) has three or more, preferably 3–6 hydroxyl groups. If polyols having less than three hydroxyl groups (i.e., diol) are used, photo-curing characteristics can not be attained and the resulting three-dimensional object lacks the desired mechanical strength. On the other hand, if polyols having more than six hydroxyl groups are used, the elongation and toughness of the resulting three-dimensional object tends to be lower.

Examples of compounds useful as component (F) are: polyether polyols prepared by modifying polyhydric alcohol of 3 or more valences, such as trimethylolpropane, glycerol, pentaerythritol, sorbitol, sucrose, quodrol, and the like, using a cyclic ether compound such as ethylene oxide (EO), propylene oxide (PO), butylene oxide, tetrahydrofuran, and the like; polycaprolactone polyols modified by caprolactone; and polyether polyols modified by a polyester consisting of a dibasic acid and diol. Specific examples of such polyols are EO modified trimethylolpropane, PO modified trimethylolpropane, tetrahydrofuran modified trimethylolpropane, caprolactone modified trimethylolpropane, EO modified glycerol, PO modified glycerol, tetrahydrofuran modified glycerol, caprolactone modified glycerol, EO modified pentaerythritol, PO modified pentaerythritol, tetrahydrofuran modified pentaerythritol, caprolactone modified pentaerythritol, EO modified sorbitol, PO modified sorbitol, caprolactone modified sorbitol, EO modified sucrose, PO modified sucrose, EO modified quodor, PO modified quodor, caprolactone modified triol. Among these, EO modified trimethylolpropane, PO modified trimethylolpropane, caprolactone modified trimethylolpropane, PO modified glycerol, caprolactone modified glycerol, PO modified sorbitol, and caprolactone modified triol are preferable.

The preferable molecular weight of the polyol used as component (F) is 100 to 2,000, and more preferably 160–1,000. If polyols having too small a molecular weight are used as component (F), it is difficult to prepare a three-dimensional object with stable shape and properties. On the other hand, if polyols having too large a molecular weight are used as component (F), the viscosity of the resulting resin composition becomes too high, resulting in decreased mechanical strength of the resulting three-dimensional object.

Examples of commercially available polyols useful as component (F) are: Sunnix TP-400, Sunnix GP-600, Sunnix GP-1000, Sunnix SP-750, Sunnix GP-250, Sunnix GP-400, Sunnix GP-600 (manufactured by Sanyo Chemical Co., Ltd.), TMP-3 Glycol, PNT-4 Glycol, EDA-P-4, EDA-P-8 (manufactured by Nippon Nyukazai Co., Ltd.), G-300, G-400, G-700, T-400, EDP-450, SP-600, SC-800 (manufactured by Asahi Denka Kogyo Co., Ltd.), TONE 0301, TONE 0305, TONE 0310 (manufactured by Union Carbide Corp.), and PLACCEL 303, PLACCEL 305, PLACCEL 308 (manufactured by Daicel Chemical Industries, Ltd.).

The above-mentioned polyols can be used as component (F) either individually or in combinations of two or more.

The proportion of component (F) in the photo-curable resin composition of the present invention is usually 5–30% by weight, preferably 6–25% by weight, and more preferably 7–20% by weight. If the proportion of component (F) is too low, photocuring characteristics are not attained and three-dimensional objects with sufficient stability in shape and properties are difficult to produce. Additionally, the toughness of the three-dimensional object tends to be reduced. On the other hand, if the proportion of component (F) is too high, the mechanical strength of the three-dimensional object obtained in the fabrication process is reduced, resulting in softening of the three-dimensional object due to the effects of water or humidity.

Optional Components

In addition to the above-mentioned components (A) to (F), various other components may be incorporated into the photo-curable resin composition of the present invention to the extent that the curability of the composition is not adversely affected. Such optional components include cationic polymerizable organic compounds other than the components (A) and (B).

Typical examples of such cationic polymerizable organic compounds are epoxy compounds, oxetane compounds, oxolane compounds, cyclic acetal compounds, cyclic lactone compounds, thiirane compounds, thietane compounds, vinylether compounds, spiro-ortho ester compounds which are reaction products of an epoxy compound and lactone, ethylenically unsaturated compounds, cyclic ether compounds, cyclic thioether compounds, vinyl compounds, and their derivatives.

Typical examples of the epoxy compounds usable as optional components are: bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ethers; polyglycidyl ethers of polyether polyols prepared by adding one or more alkylene oxide to aliphatic polyhydric alcohol such as ethylene glycol, propylene glycol, and glycerol; diglycidyl esters of aliphatic long chain dibasic acid; monoglycidyl ethers of aliphatic higher alcohol; monoglycidyl ethers of phenol, cresol, butylphenol, or polyether alcohols prepared by adding alkylene oxide to these monohydric alcohols; glycidyl esters of higher fatty acid; epoxidated soybean oil, butylepoxy stearate, octylepoxy stearate, epoxydated linseed oil, and epoxydated polybutadiene.

Typical examples of the oxetane compounds usable as optional components are: trimethylene oxide, 3,3-dimethyloxetane, 3,3-dichloromethyloxetane, 3-ethyl-3-phenoxymethyloxetane, and bis(3-ethyl-3-methyloxy) butane.

Typical examples of the oxolane compounds usable as optional components are tetrahydrofuran and 2,3-dimethyltetrahydrofuran.

Typical examples of the cyclic acetal compounds usable as optional components are trioxane, 1,3-dioxolane, and 1,3,6-trioxane cyclooctane.

Typical examples of the cyclic lactone compounds usable as optional components are b-propyolactone and e-caprolactone.

Typical examples of the thiirane compounds usable as optional components are ethylene sulfide, 1,2-propylene sulfide, and thioepichlorohydrin.

Typical examples of the thietane compounds usable as optional components are 3,3-dimethylthietane.

Typical examples of the vinylether compounds usable as optional components are ethylene glycol divinyl ether, triethylene glycol divinyl ether, and trimethylolpropane trivinyl ether.

Typical examples of the ethylenically unsaturated compounds usable as optional components are vinyl cyclohexane, isobutylene, and polybutadiene.

Optional components other than the above cationic polymerizable organic compounds include photosensitizers (polymerization promoters) of amine compounds such as triethanolamine, methyl diethanolamine, triethylamine, diethylamine; photosensitizers including thioxantone or its derivatives, anthraquinone or its derivatives, anthracene or its derivatives, perillene and its derivatives, benzophenone, benzoin isopropylether, and the like; and reaction diluents such as vinyl ethers, vinyl sulfides, vinyl urethanes, urethane acrylates or vinyl ureas.

Also, various additives may be incorporated in the photo-curable resin composition of the present invention. Such additives include polymers or oligomers, such as epoxy resin, polyamide, polyamideimide, polyurethane, polybutadiene, polychloroprene, polyether, polyester, styrene-butadiene-styrene block copolymer, petroleum resin, xylene resin, ketone resin, cellulose resin, fluorine oligomer, silicon oligomer, and polysulfide oligomer; polymerization inhibitors such as phenothiazine or 2,6-di-t-butyl-4-methyl phenol, polymerization initiation adjuvants, antioxidants, leveling agents, wettability improvers, surfactants, plasticizers, UV stabilizers, UV absorbers, silane coupling agents, inorganic fillers, resin particles, pigments, dyes and the like.

The photo-curable resin composition of the present invention can be manufactured by homogeneously blending the above-mentioned components (A) to (F), optional components, and the various additives. It is desirable for the photo-curable resin composition of the present invention to possess a viscosity at 25° C. in the range of 50–1,000 cps, preferably 70–500 cps.

Preferred photo-curable resin compositions are those that after curing experience less than a 20% change, more preferably, less than a 16% change in Young's Modulus upon exposure to relative humidity of 95% at 23° C. for 30 days.

Upon exposure to water at a temperature of 23° C. for 30 days, the preferred photo-curable resin compositions of the instant invention display a change in Young's Modulus of not more than 50%, and more preferably, not more than 47%.

Preferred compositions of the instant invention are those wherein the composition after curing, undergoes a rate of deformation of less than 0.15 mm, more preferably, less than 0.10 mm, after exposure to 50% relative humidity at 23° C. for 30 days.

Photo-fabrication process

The photo-curable resin composition of the present invention prepared in the above manner is suitable as a liquid photo-curable material useful in photo-fabrication processes. Specifically, the photo-fabrication process of the instant invention produces a three-dimensional object with a desired shape by selectively irradiating a three dimensional object coated with a thin layer of photo-curable resin, with visible light, ultraviolet light, or infrared light and allowing the photo-curable resin to cure.

Various methods may be used to selectively irradiate the photo-curable resin composition with light without specific limitations. Light irradiation processes include, for example, a scanning laser beam or other scanning light converged by a lens, mirror, or the like; irradiating with non-convergent light through a mask provided with a fixed pattern through which light is transmitted; and irradiating with light via a number of optical fibers bundled in a light conductive member corresponding to a fixed pattern. Where a mask is used, the mask electro-optically produces a mask image consisting of a light transmitting area and a non-light-transmitting area according to a prescribed pattern by the same theory as that of a liquid crystal display apparatus. A scanning laser beam with a small spot size is preferred for selectively irradiating the resin composition with light, when the resulting three-dimensional object possesses minute parts or when high dimensional accuracy is required to form the three-dimensional object.

In the above methods, the irradiated surface (for example, the plane scanned by light) of the resin composition placed in a vessel is either the liquid level of the resin composition or the surface at which the liquid contacts the wall of a transparent vessel. When the irradiated surface is the liquid level or the contact surface of the wall of the vessel, the light can be shone directly out of the vessel or through the vessel.

In the above photo-fabrication process, a desired solid shape can be made by curing fixed parts of the resin composition and then moving the light spot from the cured parts to the uncured parts continuously or gradually to laminate the cured parts. There are various methods for moving the light spot, for example, a method for moving any of the light source, the vessel for the resin composition, or the cured parts of the resin composition. Also there is a method in which fresh resin composition is supplied to the cured resin composition in the vessel.

Illustrating a typical photo-fabrication process, the surface of a support stage capable of being optionally elevated in the vessel is lowered a suitable small distance from the liquid surface to form a thin layer (1) of the resin composition, the thin layer (1) is selectively irradiated with light to form a solid cured resin layer (1'), the resin composition is supplied over this thin layer (1') to form a second thin layer (2), and this thin layer (2) is selectively irradiated with light to laminate a new solid cured resin layer (2') on the thin layer (1'). This step is repeated for a prescribed number of times, with or without changing the pattern subjected to light irradiation, to produce a three-dimensional object consisting of a multiple number of cured resin layers (n') which are integrally laminated.

The three-dimensional object fabricated in this manner is discharged from the vessel and processed to remove the unreacted photo-curable resin composition remaining on the surface, and washed by a solvent, as required. Given as examples of solvents are an organic solvent which is represented by an alcohol, such as isopropyl alcohol or ethyl alcohol, an organic solvent such as acetone, ethyl acetate, methylethyl ketone, an aliphatic organic solvent such as a terpene, or a low viscosity liquid thermosetting resin or photo-curable resin.

When forming a three-dimensional object with a smooth surface, it is desirable that the cured product be washed using the thermosetting resin or photo-curable resin. In this case, it is necessary to post-cure the product by heat emission or light irradiation depending on the type of solvent used in the washing stage. This post-curing treatment is effective not only for curing the resin remaining uncured on the surface of the laminated body, but also for curing the resin composition which remains uncured inside the laminated body. Thus, the post-curing treatment is also effective in the case where the fabricated three-dimensional object is washed with an organic solvent.

The three-dimensional object obtained in this manner has high mechanical strength, high dimensional accuracy, and excellent heat resistance. Also, the three-dimensional object exhibits high stability in maintaining a fixed shape and lasting stable properties. Therefore, the three-dimensional object prepared from the resin composition is preferably used for trial products of mechanical parts.

After the washing stage, it is desirable to cover the surface of the three-dimensional object by a heat-curable or photo-curable hard coating agent to improve the strength and heat resistance of the surface. An organic coating agent such as acryl resin, epoxy resin, silicon resin, or the like, or an inorganic coating agent can be used as hard coating agents. These hard coating agents may be used individually or in combinations of two or more.

EXAMPLES

The present invention will be explained in more detail by way of examples, which are not intended to be limiting of the present invention.

Example 1

According to the formulation shown in Table 1, 21 parts by weight of hydrogenated bisphenol A diglycidyl ether (EPOLIGHT 4000, manufactured by Kyoeisha Chemical), 49 parts by weight of 3,4-epoxycyclohexylmethyl-3',4'-epoxycyclohexane carboxylate (UVR-6110, manufactured by Union Carbide), 14 parts by weight of trimethylolpropane triacrylate (Viscoat 295, manufactured by Osaka Organic Chemical), 0.8 part by weight of triarylsulfonium hexafluoroantimonate (UVI-6974, manufactured by Union Carbide), 0.2 part by weight of diethylthioxanthone (DETX-S, manufactured by Nippon Kayaku), 1 part by weight of 1-hydroxycyclohexylphenylketone (Irgacure 184, manufactured by Ciba Geigy), and 14 parts by weight of PO modified glycerol (Sunnix GP-250, manufactured by Sanyo Chemical) were placed in a vessel equipped with a stirrer and the mixture was reacted with stirring at 60° C. for one hour to prepare a transparent liquid composition (the resin composition of the present invention). The viscosity of the resulting liquid composition was measured at 25° C. by means of a B type viscometer. The viscosity of the composition was 380 cps.

Examples 2 and 3

Transparent liquid compositions (the photo-curable resin compositions of the present invention) were prepared in the same manner as in Example 1 according to the formulations shown in Table 1, except that different components were used. The viscosity of the resulting liquid compositions were measured at 25° C. by means of a B type viscometer. The results of the viscosity of the compositions are shown in Table 1.

Comparative Examples 1–3

Transparent liquid compositions (comparative photo-curable resin compositions) were prepared in the same manner as in Example 1 according to the formulations shown in Table 1, except that different components were used. The viscosity of the resulting liquid compositions was measured at 25° C. by means of a B type viscometer. The results of the viscosity measurement of the compositions are shown in Table 1.

TABLE 1

|  | Component | Example (Pts by wt.) | | | Comparative Example (Pts by wt.) | | |
| --- | --- | --- | --- | --- | --- | --- | --- |
|  |  | 1 | 2 | 3 | 1 | 2 | 3 |
| Hydrogenated bisphenol A diglycidylether *1 | (A) | 21 | 23 | 20 | — | 70 | — |
| Butanediol diglycidyl ether *2 |  | — | — | — | 21 | — | — |
| 3,4-Epoxycyclohexylmethyl-3',4'—epoxycyclohexane carboxylate *3 | (B) | 49 | 29 | 49 | 49 | — | 70 |
| Bis (3,4-epoxycyclohexylmethyl) adipate *4 | (B) | — | — | 20 | — | — | — |
| Triarylsulfonium hexafluoro antimonate *5 | (C) | 0.8 | 1.8 | 1.8 | 0.8 | 0.8 | 0.8 |
| Trimethylolpropane triacrylate *6 | (D) | 14 | 14 | 13 | 14 | 14 | 14 |
| Diethylthioxanthone *7 | Optional | 0.2 | 0.2 | 0.2 | 0.2 | 0.2 | 0.2 |
| 1-Hydroxycyclohexyl phenylketone *8 | (E) | 1 | 1 | 2 | 1 | 1 | 1 |
| PO modified glycerol *9 | (F) | 14 | 9 | — | 14 | 14 | 14 |
| Caprolactone modified triol *10 | (F) | — | — | 14 | — | — | — |
| Viscosity (25° C.) (cps) |  | 380 | 340 | 420 | 120 | 700 | 260 |

(*1) EPOLIGHT 4000 (Kyoeisha Chemical Co., Ltd.);
(*2) Araldite DY-022 (Ciba Geigy);
(*3) UVR-6110 (Union Carbide Corp.);
(*4) UVR-6128 (Union Carbide Corp.);
(*5) UVI-6974 (Union Carbide Corp.);
(*6) Viscoat 295 (Ciba Geigy);
(*7) DETX-S (Nippon Kayaku Co., Ltd.);
(*8) Irgacure 184 (Ciba geigy);
(*9) Sunnix GP-250 (Sanyo Chemical Industries, Ltd.);
(*10) TONE-3010 (Union Carbide Corp.)

As shown in Table 1, all of the compositions prepared in Examples 1–3 have a viscosity suitable for the resin composition used in the photo-fabrication processes.
Evaluation of Photo-Curable Resin Composition The photo-curable resin compositions prepared in Examples 1–3 and Comparative Examples 1–3 were evaluated by measuring the change in the Young's modulus and deformation over time of the resulting cured products according to the following method. The results are shown in Table 2.

(1) Preparation of Test Specimens

A coated film with a thickness of 200 μm was prepared by applying a composition on a glass plate using an applicator. The surface of the film was irradiated with ultraviolet light at a dosage of 0.5 J/cm² using a conveyer curing apparatus equipped with a metal halide lamp to prepare a half-cured resin film. Next, the half cured resin film was peeled from the glass plate and placed on releasable paper. The side opposite to that first cured by irradiation with ultraviolet light was irradiated with ultraviolet light at a dosage of 0.5 J/cm² to prepare a completely cured resin film.

The cured resin film thus prepared was allowed to stand under the atmospheric conditions described below to produce four test specimens (1) to (4).

Specimen (1) was prepared at a temperature of 23° C. under a humidity of 50% and allowed to stand in a thermo-hygrostat for 24 hours.

Specimen (2) was prepared at a temperature of 23° C. under a humidity of 50% and allowed to stand in a thermo-hygrostat for 30 days.

Specimen (3) was prepared at a temperature of 23° C. under a humidity of 95% and allowed to stand in a thermo-hygrostat for 30 days.

Specimen (4) was prepared at a temperature of 23° C. and allowed to stand in water for 30 days.

(2) Measurement

The test specimen (1) was used for measuring the initial Young's modulus and the test specimens (2)–(4) were used for measuring the change in the Young's modulus over time. The measurements were made at a temperature of 23° C. and at a humidity of 50% under the conditions of a drawing rate of 1 mm/min and a bench mark distance of 25 mm.

Deformation Over Time (1) Preparation of Test Specimens

Using a photo-fabrication apparatus (Solid Creator JSC-2000, manufactured by Sony Corporation) equipped with a light source for applying an argon ion laser beam (wave length of 351 nm and 365 nm), a photo-curable resin composition was selectively irradiated by the laser beam under the conditions of a laser power of 100 mW measured on the irradiated surface (liquid level) and a scanning speed of 200–500 mm/s, to form a cured resin film with a thickness of 0.20 mm. This fabricating procedure was repeated many times to form a model 10 for measurement (hereinafter called camber model) as shown in FIG. 1. The camber model was then discharged from the photo-fabrication apparatus, then the residual resin composition adhering to the outer surface of the camber model was released, and the excess resin composition was removed using a solvent.

(2) Measurement

Figure 2:
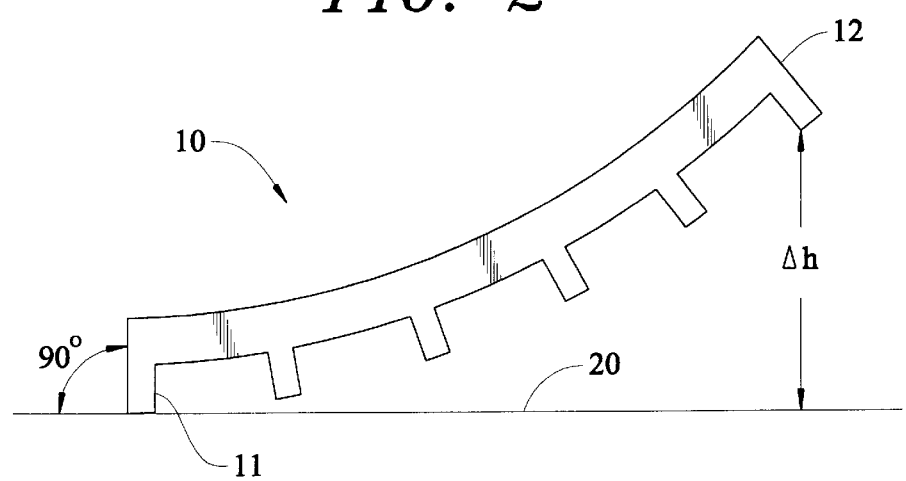
FIG. 2 is a side elevation view of the camber model of FIG. 1 in the lifted position.

As shown in FIG. 2, measurements were made by securing the bottom of a foot part 11 on one end of the camber model 10 to a plane 20 and measuring the distance (lift length Δh mm) between the plane 20 and the bottom of a foot part 12 on the opposite end to determine the primary camber rate. After the camber model 10 was allowed to stand in a thermo-hygrostat at 23° C. at a humidity of 50% for 30 days, the camber rate was measured in the same manner as in the above procedure.

TABLE 2

| | Young's Modulus over Time (kg/mm²) | | | | Rate Of Deformation Over Time (Single Model) Camber Amount (mm) | |
|---|---|---|---|---|---|---|
| | Specimen (1) | Specimen (2) | Specimen (3) | Specimen (4) | | |
| | 23° C., 50% RH, 24 hrs | 23° C., 50% RH, 30 days | 23° C., 95% RH, 30 days | 23° C., in water, 30 days | Initial Value | After 30 days |
| Example 1 | 210 | 220 | 180 | 110 | 0.00 | 0.05 |
| Example 2 | 190 | 200 | 165 | 100 | 0.00 | 0.10 |
| Example 3 | 220 | 220 | 185 | 115 | 0.00 | 0.05 |
| Comp. Example 1 | 170 | 165 | 11 | 5 | 0.00 | 0.20 |
| Comp. Example 2 | | product did not cure | | | not measurable | |
| Comp. Example 3 | 200 | 220 | 140 | 85 | 0.25 | 1.66 |

Table 2 shows that all cured products from the photo-curable resin compositions of the present invention prepared in the Examples 1–3 have excellent mechanical properties with a large Young's modulus and a small deformation over time. Also, the cured products from the resin compositions have excellent shape stability with a small camber amount due to shrinkage during curing.

In contrast, the cured products formed from the composition prepared in the Comparative Example 1, using butane-diol diglycidyl ether, instead of component (A), exhibit a large change over time in the Young's modulus in high humidity and in water.

The resin composition prepared in Comparative Example 2, excluding component (B), exhibits low photo-curing characteristics, thereby making the curing of the product problematic, even when cured by irradiation with either UV light or a laser beam. This comparative composition was therefore unsuitable for compositions used in the photo-fabrication process.

The resin composition prepared in the Comparative Example 3, excluding component (A), exhibits a large change in the Young's modulus in high humidity and in water. Also, this comparative composition had a large deformation rate over time.

The photo-curable resin composition of the present invention can produce cured products with minimal change in mechanical properties and deformation rate over time, high dimensional accuracy, and excellent mechanical strength, heat resistance, moisture and water resistance. The cured product is therefore suitable for use as a three-dimensional object, such as for example, a trial product for mechanical parts.

In addition, the photo-fabrication process using the photo-curable resin composition of the present invention provides a three-dimensional object possessing excellent primary characteristics and high durability.

What is claimed is:

1. A photo-curable resin composition comprising, (A) an epoxy compound represented by the formula (1)

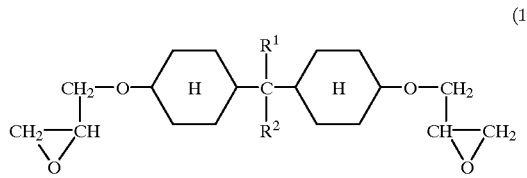

(1)

wherein $R^1$ and $R^2$ independently represent a hydrogen atom or a methyl group, (B) a compound having a cyclohexene oxide structure,
(C) a cationic photo-initiator,
(D) an ethylenically unsaturated monomer,
(E) a radical photo-initiator, and
(F) a polyol having three or more hydroxyl groups.

2. The photo-curable resin composition of claim 1, wherein said epoxy compound of formula (1) is selected from the group consisting of: hydrogenated bisphenol A diglycidyl ethers, hydrogenated bisphenol F diglycidyl ethers, and hydrogenated bisphenol AD diglycidyl ethers.

3. The photo-curable resin composition of claim 1, wherein, relative to the total amount of resin composition:

component (A) is present in an amount from about 5 wt. % to about 40 wt. %;
component (B) is present in an amount from about 50 wt. % to 100 wt. %;
component (C) is present in an amount of about 0.1 wt. % to about 10 wt. %;
component (D) is present in an amount from about 5 wt. % to about 30 wt. %;
component (E) is present in an amount from about 0.01 wt. % to about 10 wt. %; and
component (F) is present in an amount from about 5 wt. % to about 30 wt. %.

4. The photo-curable resin composition of claim 1, wherein component (D) is a poly-functional ethylenically unsaturated monomer.

5. The photo-curable resin composition of claim 1, wherein component (D) is a poly-functional ethylenically unsaturated compound having at least three ethylenically unsaturated groups.

6. The photo-curable resin composition of claim 1, wherein said composition once cured, and after exposure to 95% relative humidity and 23° C. for 30 days, displays a relative change in Young's Modulus of not more than 20%.

7. The photo-curable resin composition of claim 1, wherein said composition after curing, and after exposure to water at 23° C. for 30 days, displays a relative change in Young's Modulus of not more than 50%.

8. The photo-curable resin composition of claim 1, wherein said composition after curing, has a rate of deformation of less than 0.10 mm after 30 days.

9. The photo-curable resin composition of claim 1, wherein said composition has a viscosity at 25° C. of between 50 to 1,000 cps.

10. A three-dimensional object comprising a cured photo-curable resin composition comprising:

(A) an epoxy compound represented by the formula (1)

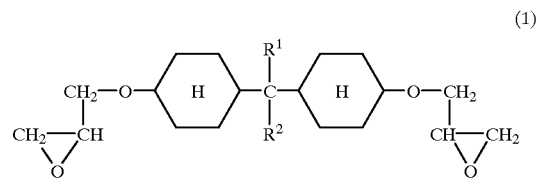

(1)

wherein $R^1$ and $R^2$ independently represent a hydrogen atom or a methyl group, (B) a compound having a cyclohexene oxide structure,
(C) a cationic photo-initiator,
(D) an ethylenically unsaturated monomer,
(E) a radical photo-initiator, and
(F) a polyol having three or more hydroxyl groups.

11. A process for photo-fabricating a three-dimensional object comprising the steps of selectively curing a photo-curable resin, wherein said photo-curable resin comprises:

(A) an epoxy compound represented by the formula(1)

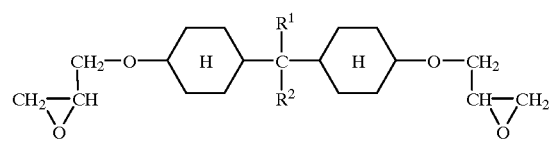

wherein $R^1$ and $R^2$ independently represent a hydrogen atom or a methyl group, (B) a compound having a cyclohexene oxide structure,
(C) a cationic photo-initiator,
(D) an ethylenically unsaturated monomer,
(E) a radical photo-initiator, and
(F) a polyol having three or more hydroxyl groups.

* * * * *